United States Patent [19]
Takasugi

[11] Patent Number: 6,009,036
[45] Date of Patent: Dec. 28, 1999

[54] MEMORY DEVICE

[75] Inventor: Atsushi Takasugi, Tokyo, Japan

[73] Assignee: Oki Electric Industry Co., Ltd., Tokyo, Japan

[21] Appl. No.: 09/101,003

[22] PCT Filed: Oct. 30, 1997

[86] PCT No.: PCT/JP97/03954

§ 371 Date: Jun. 29, 1998

§ 102(e) Date: Jun. 29, 1998

[87] PCT Pub. No.: WO98/19309

PCT Pub. Date: May 7, 1998

[30] Foreign Application Priority Data

Oct. 30, 1996 [JP] Japan .................................. 8-288603

[51] Int. Cl.[6] .................................................. G11C 13/00
[52] U.S. Cl. ................ 365/230.01; 365/189.01
[58] Field of Search ........................ 365/230.01, 185.01, 365/189.02, 189.05, 205

[56] References Cited

U.S. PATENT DOCUMENTS

| | | | |
|---|---|---|---|
| 4,366,559 | 12/1982 | Misaizu et al. | 365/205 |
| 4,947,373 | 8/1990 | Yamaguchi et al. | |
| 5,313,431 | 5/1994 | Uruma et al. | |

Primary Examiner—Terrell W. Fears
Attorney, Agent, or Firm—Jones Volentine, LLP

[57] ABSTRACT

The object of the present invention is to provide a memory with reduced port area and excellent cost performance by combining a conventional multiport DRAM with a DRAM used as a temporary buffer, without losing the strong points of a conventional multiport DRAM, and in order to achieve that object, a memory of the present invention has a multiport DRAM and a general purpose DRAM having consecutive X addresses, common Y address and common control terminals, in order to promote efficient refresh control.

8 Claims, 14 Drawing Sheets

MEMORY DEVICE

TECHNICAL FIELD

The present invention relates to the circuit structure of a semiconductor memory.

BACKGROUND ART

Recently, with the spread of the internet and the spread of colour copiers, the market for digital still cameras that read photgraphic data directly into a personal computer (PC) has been growing rapidly.

A simple block diagram of a conventional digital still camera system is shown in FIG. 2. The internal processing of the digital still camera system will be described below referring to FIG. 2. In order to simplify the description, the digital still camera system will be referred to simply as a "camera" in the following.

Image information is taken in to the camera through a charge coupled device (CCD) a. Next, the image data that has been taken in is converted to a digital signal by an input section IC b, and taken in to a graphics memory e. It is common for cameras of intermediate quality or higher to use multiport DRAM or memory known as VRAM in a graphics buffer. This type of multiport DRAM is an internationally standardized memory having two ports, namely a DRAM port that operates exactly the same a general use DRAM, and a SAM port capable of serial access for displaying a picture on a CRT or liquid crystal screen etc.

Data taken in from the CCD can be supplied as a moving image seen through the eyes of camera user either as a video output via sequentially writing into the multiport DRAM, video encoder h, D-A converter i and buffer j, or actually seen on a liquid crystal panel k etc. This is the circuit operation when a picture taken by a television camera is immediately viewed on a television set and not transformed.

Further, in a general camera, there is a shutter in a key input section d, and from the time when a shutter key is caused to be pressed by a digital still container c comprising ROM, RAM, a micro processor core, and a timer, etc., CCD input from a is suspended, and image compression of image information that has been stored in the multiport DRAM (an image at the instant the shutter was pressed) is commenced.

The information stored in the multiport DRAM e is taken in as fixed block information, and the result of compression is temporarily stored in buffer memory f (a general purpose DRAM is generally used).

Here, the SAM port of the multiport DRAM keeps outputting video in the same way as before the shutter is pressed, even while the image information stored in the multiport DRAM is being compressed and transferred to the buffer memory f. At this time, new image information is not transmitted from the CCD, so an image output from the video camera is a still image (the compressed image is this outputted still image).

When this graphics memory does not have the above mentioned two port multiport DRAM, but uses a conventional general purpose memory such as a single port memory, there is no video output while an image obtained by pressing the shutter is being compressed, in other words, an image being viewed by a user is totally dark. Accordingly, the commercial value as a camera does not compare very favorably to a camera using a multiport DRAM.

When video output continues to be output while the shutter is pressed and image data is being compressed, without using this multiport DRAM, a new, separate image memory is currently necessary for image output. Also, as will be described later, in the future a method is being considered of replacing a general purpose DRAM and using an extremely fast synchronous DRAM (SDRAM), and carrying out image compression and video output in time division.

When this type of new separate memory for graphics is used, the mounting area on a port is increased, the number of components is also increased, and the cost therefore rises. Further, when an extremely fast synchronous DRAM (SDRAM) has been used, control becomes difficult, it is unavoidable that accesses to the memory are more than doubled (because compression and video output are carried out at two ports), guaranteeing an operating margin becomes extremely difficult, and the design of the controller is troublesome.

Next, the multiport DRAM e in FIG. 2 will be described in detail. FIG. 3 is a circuit diagram of a conventional multiport DRAM.

First of all, the function of signals input to the control signal generator I in FIG. 3 will be described. Control signals generated from the control signal generator I are actually input to each of the circuits shown in FIG. 3, but this has been omitted for simplification, and these signals control the access operation of the multiport DRAM. RAS/ is a row address strobe, CAS/ is a column address strobe, WE/ is write enable, DT/OE/ is data transfer and output control, SC is serial clock, and SE/ is a serial access enable signal.

Next, the connectional relationship of each element will be described.

As shown in FIG. 3, memory cell units Cij ($i=1\sim n, j=1\sim m$: where m, n are arbitrary integers), comprised of one memory cell capacitor and one transistor, are connected to a word line WLj ($j=1\sim m$: where m is an arbitrary integer), and one bit line of a bit line pair BLi, /BLi ($i=1\sim n$: where n is an arbitrary integer) being complementary signal lines.

Sense amplifiers SAk ($k=1\sim n$: where n is an arbitrary integer) are connected between the bit line pairs BLi, /BLi. Transistors Trai, Trai/ ($i=1\sim n$: where n is an arbitrary integer), constituting means for switching between the bit lines BLi, and /BLi, are connected between the left end portion of the bit line pairs BLi,/BLi and data buses D,/D.

Transistors Trbi, Trbi/ ($i=1\sim n$: where n is an arbitrary integer), constituting means for switching between the bit lines BLi,and/BLi, and transistors Trci, Trci/ ($i=1\sim n$: where n is an arbitrary integer), constituting means for switching between serial data buses SD, /SD, are connected in series between the right end portion of the bit line pairs BLi, /BLi and the serial data buses SD, /SD.

Flip-flops Fi ($i=1\sim n$: where n is an arbitrary integer), comprised of inverters connected in opposite directions, are connected between the point of connection of Trbi and Trcl, and the point of connection of Trbi/ and Trci/.

In this way, a column unit Ci ($i=1\sim n$: where n is an arbitrary integer) is made up of a memory cell unit Cij, the complementary signal lines constituting the bit line pair BLi, /BLi, sense amplifier SAk, transistors Trai, Trai/, transistors Trbi, Trbi/, transistors Trci, Trci/ and the flip-flop Fi.

When an address is input from the address terminals ADD, address generator D outputs a Y address YA. This Y address YA is input to Y decoder B, and the Y decoder B outputs a column unit select signal output YDi. This column unit select signal output YDi is a signal for switching Trai and Trai/.

An X address XA, being another output from the address generator D, is input to X decoder A, and this X decoder A selects a word line WLi.

The output section of address generator D is connected to the input section of serial address generator J, with this serial address generator J outputting a serial address SA and inputting this serial address SA to serial decoder F.

This serial decoder F outputs a column unit select signal output SDi for switching Trci and Trci/.

Data buses D, D/ are connected to input/output unit E having I/O terminals, while the data buses SD, SD/ arc connected to input/output unit G having SI/O terminals.

Next, the operation of the multiport DRAM of FIG. 3 will be described with reference to FIG. 4.

The operation of the DRAM will be described for each instant shown in FIG. 4.

First, at time t0, RAS/ falls, and an X address XAD externally input from the address terminals ADD is taken in. This X address XAD is input to the address generator D and an internal X address XA is generated. This internal X address XA is input to the X decoder. The X decoder selects a word line selected by XA from among a word line group. Accordingly, WLi rises at almost the same time. After that, information for all memory cell units connected to WLi (a minute load) is transferred to one bit line of a bit line pair that has been previously charged to half the power supply voltage, namely VCC/2, and a minute potential difference is generated across all the complementary bit lines. This minute potential difference is amplified by a sense amplifier, and the potential difference across all the complementary bit lines is amplified to VCC.

At time t1 CAS/ falls, and a Y address YAD externally input from the address terminals ADD is taken in. This YAD is input to the address generator D and an internal Y address YA is generated and input to the Y decoder B. The Y decoder B selects, for exanple, column unit Ci selected by YA from among a group of column units. That is, Y decoder output Ydi rises, Trai, Trai/ are turned ON and information that has been amplified on the bit line pairs BLi, /BLi is transferred to the data buses D, D/. This information is transferred to input/output unit E through the data bus pair D, D/, and output from output terminals.

At time t4, CAS/ falls, and the-next Y address YAD from address terminals ADD is taken in, similarly to the situation at time t1 (here, the Y address is input incrementally). This YAD is input to address generator D, an internal Y address YA is generated and this internal Y address YA is input to Y decoder B. The Y decoder B selects column unit Ci+1 selected by YA, from among a group of column units. That is, Y decoder output Ydi+1 rises, Trai+1, Trai+1/ are turned ON and information that has been amplified on the bit line pairs BLi+1, /BLi+1 is transferred to the data buses D, D/. This information is transferred to input/output unit E through the data bus pair D, D/, and output from output terminals. Page mode reading of the DRAM section can be carried out by repeating the above operations.

At time t6, RAS/ and CAS/ rise, and WLi falls.

At time t7 Bli, BLi/ are equalized to a level of VCC/2, and are put in a reset state.

At time t8, the next RAS/ cycle begins.

Next, the operation of a SAM cycle (taking a read operation as an example) will similarly be described for each instant shown in FIG. 4.

When RAS/ is at a low level in the cycle prior to FIG. 4, DT/OE/ is in a low level cycle (called a data transfer cycle). In this cycle, information for all memory cells connected to a word line designated by an input X address is transferred in one go to data register Fi (where i=1~n, here Fi is a flip flop), after being amplified by the sense amplifier operation as has been described previously, by the rising of transfer signal PDT.

At time t2, SE/ falls, putting the device into serial access possible operation mode.

At time t3, in synchronism with the rising of SC immediately after the falling of SE/ at time t2, output YSD1 of the serial decoder F, corresponding to a Y address input during a data transfer cycle, rises, and data stored in the flip flop F1 is transferred to data buses H, H/ because Trbi, Trbi/ are ON. The transferred data is transferred to input/output unit G and output from terminals SI/O.

At time t5, in synchronism with the next rising of SC, data of an address that is the address accessed at time t1+1 (flip flop F1) is output from terminals SI/O by the same circuit operation as for time t3. (The output YSD2 of the serial decoder F rises, and data stored in the flip flop F2 is transferred to data buses H, H/ because Trb2, Trb2/ are on. The transferred data is transferred to the input/output unit G.) After that, serial output continues in synchronism with the rising of SC.

At time t7, SI/O is put in to a high impedance state by the rising of SE/.

Instead of a multiport DRAM such as that described above, an example using a Synchronous DRAM can also be considered. This synchronous DRAM has a page mode as fast as 80–100 MHz compared to the 40–50 MHz page mode of a general purpose DRAM, so it is possible to use the synchronous DRAM as both a graphics memory and a buffer memory even if it only has a single port, by taking advantage of the high speed and performing time divided processing.

However, when such a synchronous memory is used, the system is caused to operate at twice the conventional speed, and since time shared processing is carried out, design of a controller is extremely complicated and system operating margin design is also difficult.

In an image processor system, such as the foregoing digital still camera system, that carries out image processing using a buffer memory simultaneously with presenting an image on a CRT or liquid crystal display, etc., and has a restricted mounting area on a system port, using a two-port multiport DRAM and a buffer DRAM can not reduce the mounting area on a system port, and even if a synchronous DRAM is used design of a controller is extremely complicated.

It is therefore an object of present invention to provide a memory for use in a high performance digital still camera, that is easy to use and reduces the board surface area utility.

DISCLOSURE OF THE INVENTION

In order to achieve the above stated object, a semiconductor memory device capable of random access of the present invention comprises: address generator, provided with external address signals, for generating an internal X address and an internal Y address; serial address generator for generating a serial address; a single port first memory section, comprised of a first memory array having memory unit groups, for connecting first X decoder supplied with the internal X address and first Y decoder supplied with the internal Y address, and a first data bus connected to the first Y decoder; a two port second memory section, comprised of a second memory array having memory unit groups for connecting second X decoder supplied with the internal X address and second Y decoder supplied with the internal Y address, a second data bus connected to the second Y decoder and connected to the first data bus, data register for connecting to the second memory array, serial decoder for connecting to the data register and supplied with the serial address, and a third data bus connected to the serial decoder; first input unit having input output terminals for connecting a mutually connected first data bus and second data bus; second input output unit having at least output terminals for connecting to a third data bus; and control signal generator, supplied with external control signals for controlling a memory comprising the above structural elements, for generating internal control signals for controlling memory peripheral circuits capable of memory access. In this way, by combining a conventional multiport DRAM with a DRAM used as a temporary buffer, without losing the strong points gained from a conventional multiport memory, it is possible to provide a memory with reduced port area and excellent cost performance.

BRIEF DESCRIPTION OF THE NUMERALS

PREFERRED EMBODIMENTS OF THE INVENTION

The present invention will be described in detail below with reference to the drawings.

Figure 1:
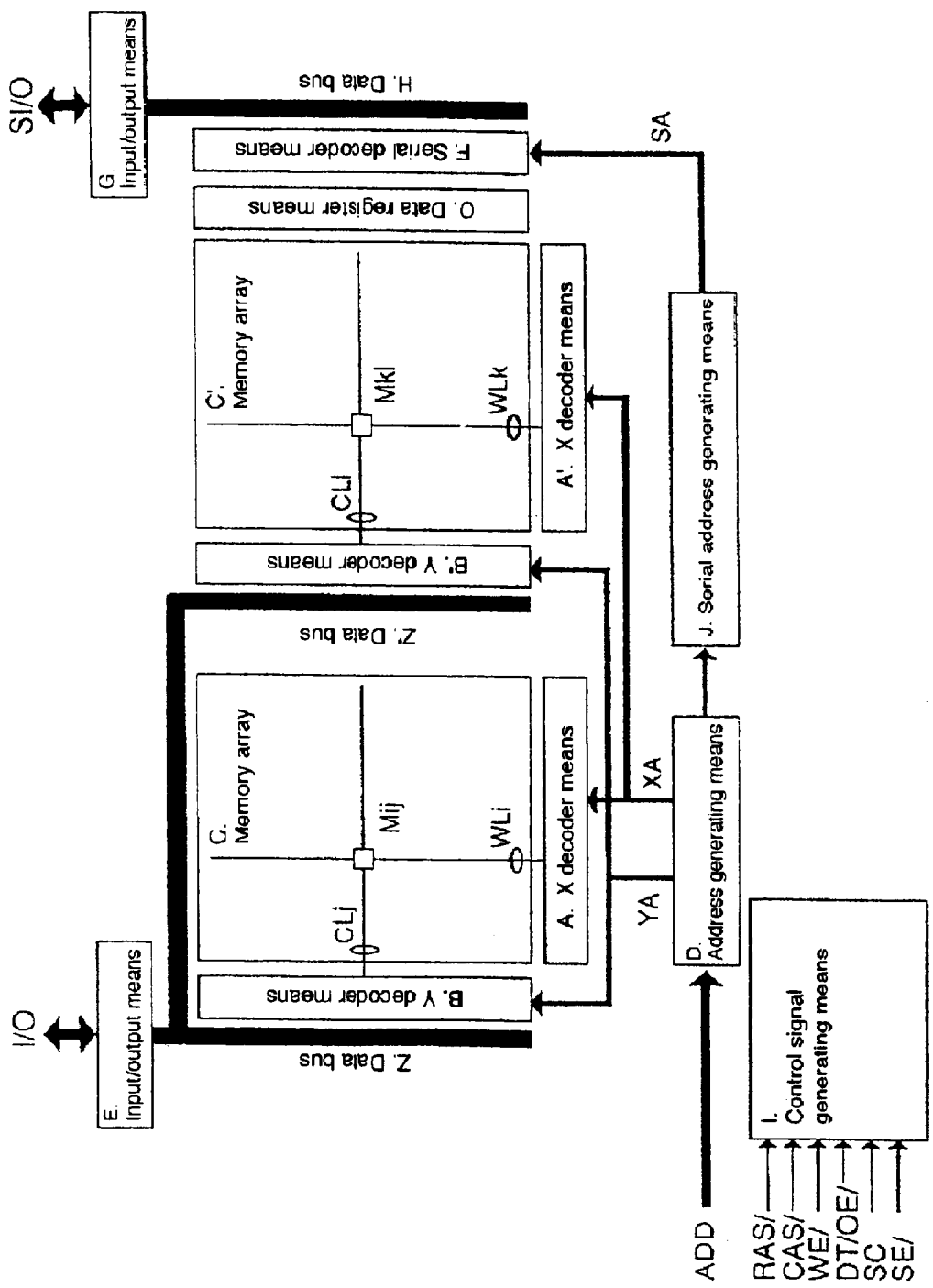
FIG. 1 is a drawing showing the basic circuit of the present invention.
Figure 3:
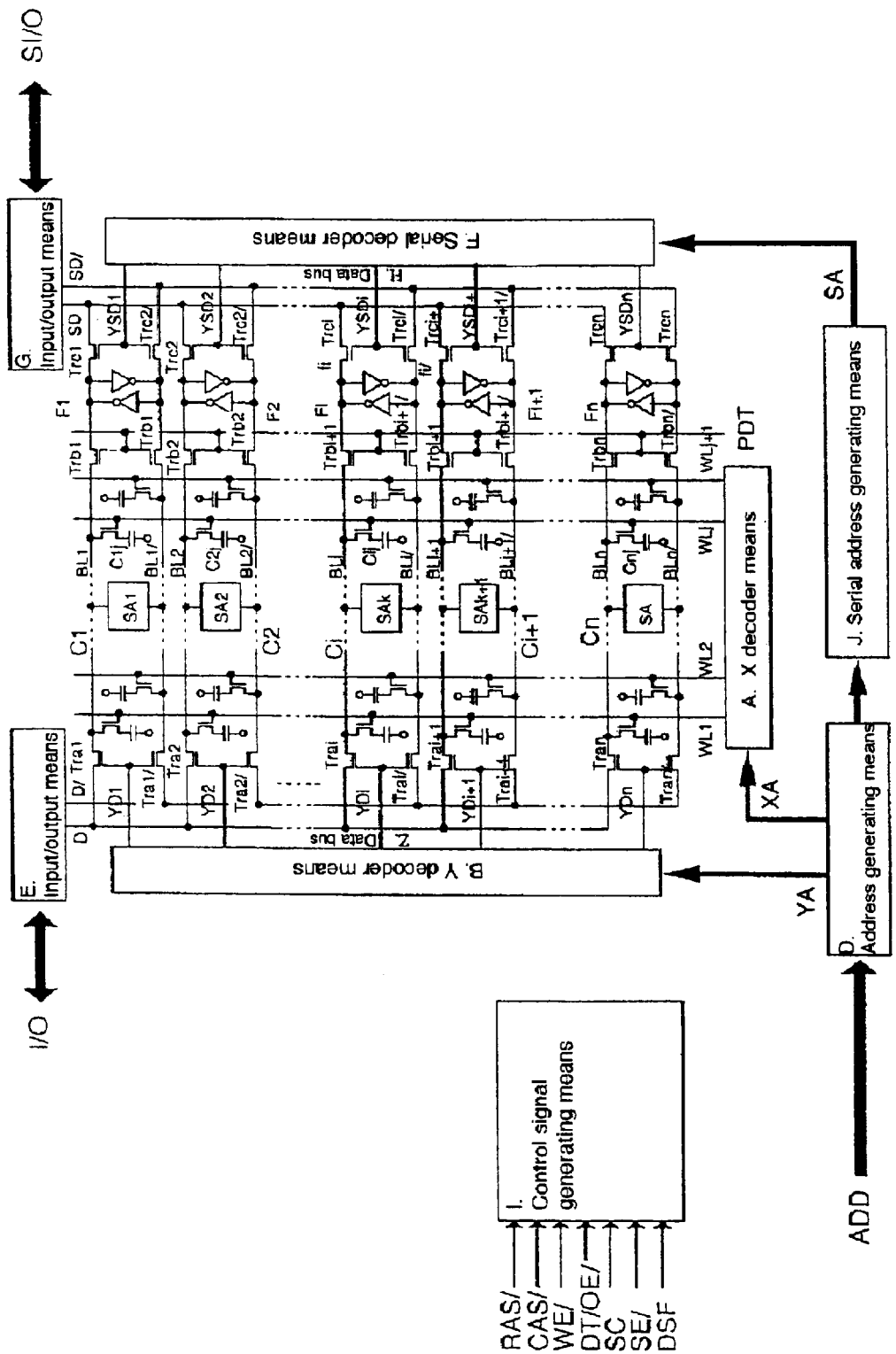
FIG. 3 is a drawing showing a conventional multiport DRAM.

The basic circuit of the present invention is shown in FIG. 1, and FIG. 3 shows the circuit operation of the circuit in FIG. 1.

As has been described in the description of the operation of a conventional multiport DRAM, control signals that are the same as control signals of a multiport DRAM are input to control signal generator I, and signals for controlling each of the circuit elements of this memory are generated. In this case, these signals are not shown, in order to simplify the drawing. Externally input control signals for realizing the circuit operation of this embodiment do not have to be only those shown, for example, it is possible to have two RAS/ signals for refresh control of different memory sections (this is also true for later embodiments).

Externally input address ADD is connected to address generator D, and the X address XA output from the address generator D is input to X decoder A and X decoder A'. Similarly, Y address YA output from the address generator D is input to Y decoder B and Y decoder B'.

The address generator D is connected to serial address generator J. Serial address SA is generated by the serial address generator J and input to serial decoder F. An input Y address constitutes a leading address of a serial access in the multiport DRAM, so in this case the serial address generator J is connected to the address generator D. However, the serial address generator J does not have to be connected to the address generator D and another method can be used to generate the address input of the serial address generator J. As an example, it is possible to determine the leading address of a serial access using an internal reset signal.

The memory cell array C is comprised of a plurality of memory cell units Mij (i=1~m, j=1~n), and the memory array C' similarly comprises a plurality of memory cell units Mkl (k=1~m, l=1~b).

A plurality of word lines are connected to the X decoder A, and a incertain arbitrary word line WLi is selected from among the plurality of word lines using an inputted address XA. This word line WLi is connected to a plurality of memory output units, and after this word line has been selected information for this plurality of memory cell units is loaded onto a connected column line CLj (bit line). Y decoder B selects an arbitrary column line CLi using an inputted Y address YA.

A plurality of word lines are connected to the X decoder A', and a certain arbitrary word line WLk is selected from among the plurality of word lines using an inputted address XA. This word line WLk is connected to a plurality of memory output units, and after this word line has been selected information for this plurality of memory cell units is loaded onto a connected column line CL1 (bit line). Y decoder B' selects an arbitrary column line CLk using an inputted Y address YA.

An address input to the X decoder A and the X decoder A' are consecutive addresses (for example, with X address XA for selecting memory on memory array C in the range 0000000000~0111111111111, an X address XA for selecting a memory in memory array would be in the range 1000000000~111111111111).

In this embodiment, Y addresses YA input to Y decoder B and the Y decoder B' are exactly the same. These addresses do not have to be exactly the same, but when taking into consideration the simplicity pattern design for an actual device, this is generally the case.

The Y decoder B transfers information of memory cell units Mij that have been selected by word line WLi and column line CLi onto data bus Z, and the transferred information is output from I/O terminals through input/output unit E.

The Y decoder B' transfers information of memory cell units Mij that have been selected by word line Wlk and column line CL1 onto data bus Z', and the transferred information is output from I/O terminals through input/output unit E.

Data bus Z and data bus Z' are mutually connected, and are also connected to input/output unit E.

Data register O, comprised of data register units, is connected to memory array C' (each column line CLi is connected to a respectively corresponding data register unit), the serial decoder F is selected by serial address SA, information of data register O constituting the data register is transferred to data bus H and the transferred information is output from I/O terminals via the input/output unit G.

Memory circuitry including the memory array C has the operation of general purpose DRAM, while memory circuitry including memory array C' has the operation of a multiport DRAM. These circuits and circuit operations will be omitted here.

The basic features of the present embodiment are as follows.

a) A general purpose DRAM and a multiport DRAM are combined.

b) The data bus of the general purpose DRAM section and the data bus of the DRAM port of the multiport DRAM section are connected.

c) The above mentioned data buses are connected to common input/output unit.

d) X addresses of the general purpose DRAM section and X addresses of the multiport DRAM section are consecutive,(for example, with X address XA for selecting memory on memory array C in the range 0000000000~011111111111, an X address XA for selecting a memory in memory array would be in the range 1000000000~111111111111).

e) Control signals for general purpose DRAM section and the multiport DRAM section are common. In this embodiment, specifically, a widely used general purpose DRAM and a multiport DRAM are used, but it is not absolutely necessary to have a general purpose DRAM and a multiport DRAM, and it is possible to use a memory having a DRAM, a DRAM port and a separate function port. Also, the DRAM does not have to be DRAM, and other memory such as SRAM etc. can be used.

It is not absolutely necessary for all of the control signals for the general purpose DRAM section and the multiport DRAM section to be common, and it is possible for some of them to be not common.

With the above described construction, in an image processor system such as then foregoing digital still camera system that carries out image processing using a buffer memory, simultaneously with presenting an image on a CRT or liquid crystal display, etc., and has a restricted mounting area on a system port, since two different memories, namely a single port memory and a two port memory, are integrated into a single chip, the mounting area on a system port can be reduced. Also, since it has a two port device, a memory does not need to be operated at high speed in a time divided manner, such as when achieving functions with a single port device. This means that a controller can be the same as a conventional controller, and design of a controller etc. does not become extremely complicated. X addresses for the single port device and the two port device are consecutive, Y address inputs are common and the input output unit for the single port memory and the two port memory are made common, which means that wiring of the port is simplified and it is possible to provide the best memory for constructing a portable system such as a digital still camera system.

Second Embodiment

Figure 6:
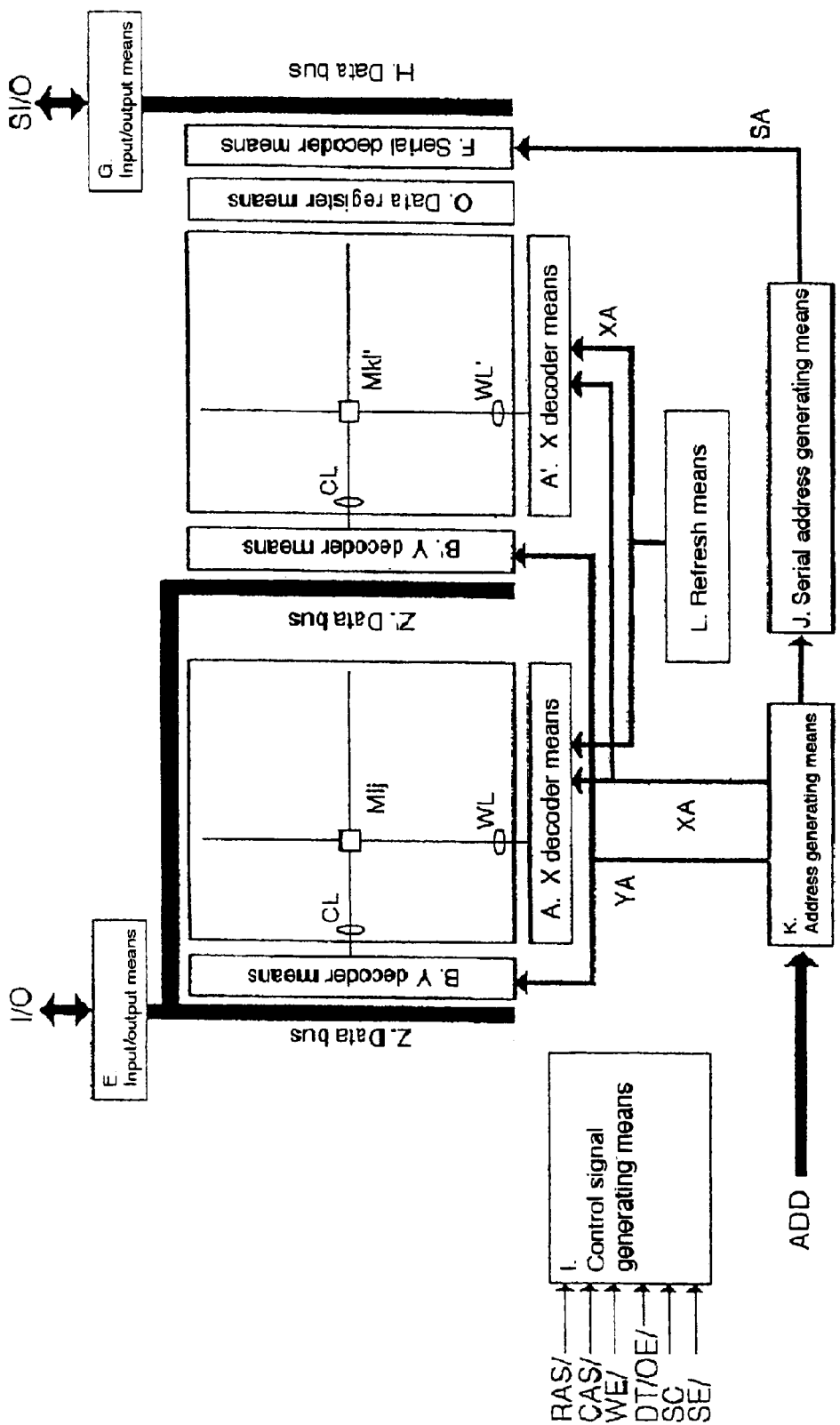
FIG. 6 is a circuit diagram of a second embodiment of the present invention.

The connectional relationship of a second embodiment of the present invention is shown in FIG. 6.

The connectional relationship is substantially the same as in the first embodiment. This embodiment is different from the first embodiment in that refresh means L is additionally provided, and a refresh address XA' is output to the X decoder A and the X decoder A'. The refresh means L is controlled by refresh control signals generated by the control signal generator I, but these signals are omitted from the drawing for simplification. The circuit operation is also the same as the first embodiment.

The refresh means L is constructed either having an external clock input supplied to a counter, with a refresh address generated by the address counter causing a refresh address to be generated, or having an internal clock automatically generated by an internal oscillator and input to the above mentioned address counter, with a refresh address generated by the address counter causing a refresh address to be generated.

The refresh operation is the same as a normal memory operation, and so description thereof is omitted. This refresh operation differs from a normal memory operation in that a Y address is not input to the Y decoder, the Y decoder does not generate a column select signal (Y decoder output), and a read signal is not transferred to the data bus.

The basic features of the second embodiment are the same as those of the first embodiment, but because the refresh means L is added refresh can be carried out without supplying an external address.

Using the structure as has been described above, in addition to the effects of first embodiment, there is no need to generate an X address as in the case when refresh is done externally, and since refresh can be carried out internally, there is no need to provide clock generator inside a controller for controlling refresh.

Third Embodiment

Figure 7:
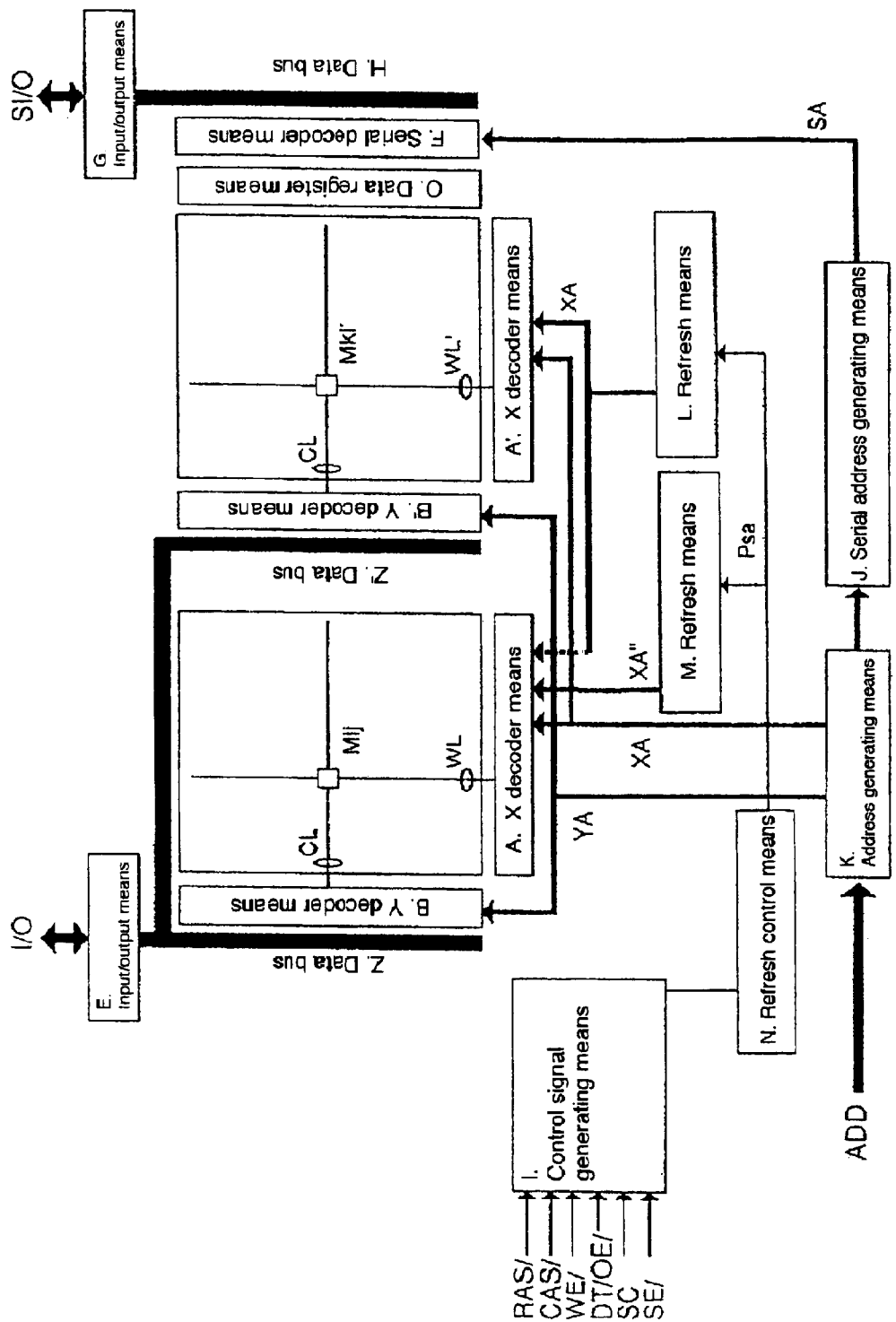
FIG. 7 is a circuit diagram of a third embodiment of the present invention.

A circuit diagram of the third embodiment is shown in FIG. 7.

Refresh control means N connected to the control signal generator, and refresh means M supplied with a mode switch signal Psa generated by the refresh control means N, are newly added, and refresh address XA" is only output to X decoder A. The refresh means L outputs address XA', generated in the same way as in the second embodiment, to X decoder A and X decoder A' (depending on the purpose, it is not always necessary to input XA' to address decoder A).

The circuit operation is substantially the same as the second embodiment, but for the following points.

a) The refresh operation of a memory section including memory array C can be carried out independently of the refresh of a memory section including memory array C'.

b) The memory section including memory array C' can be refreshed while accessing the memory section including memory array C.

c) When the X addresses of the memory section including memory array C and the memory section including memory array C' are consecutive, refresh operations of both memory section can be controlled by only the refresh means L.

Figure 2:
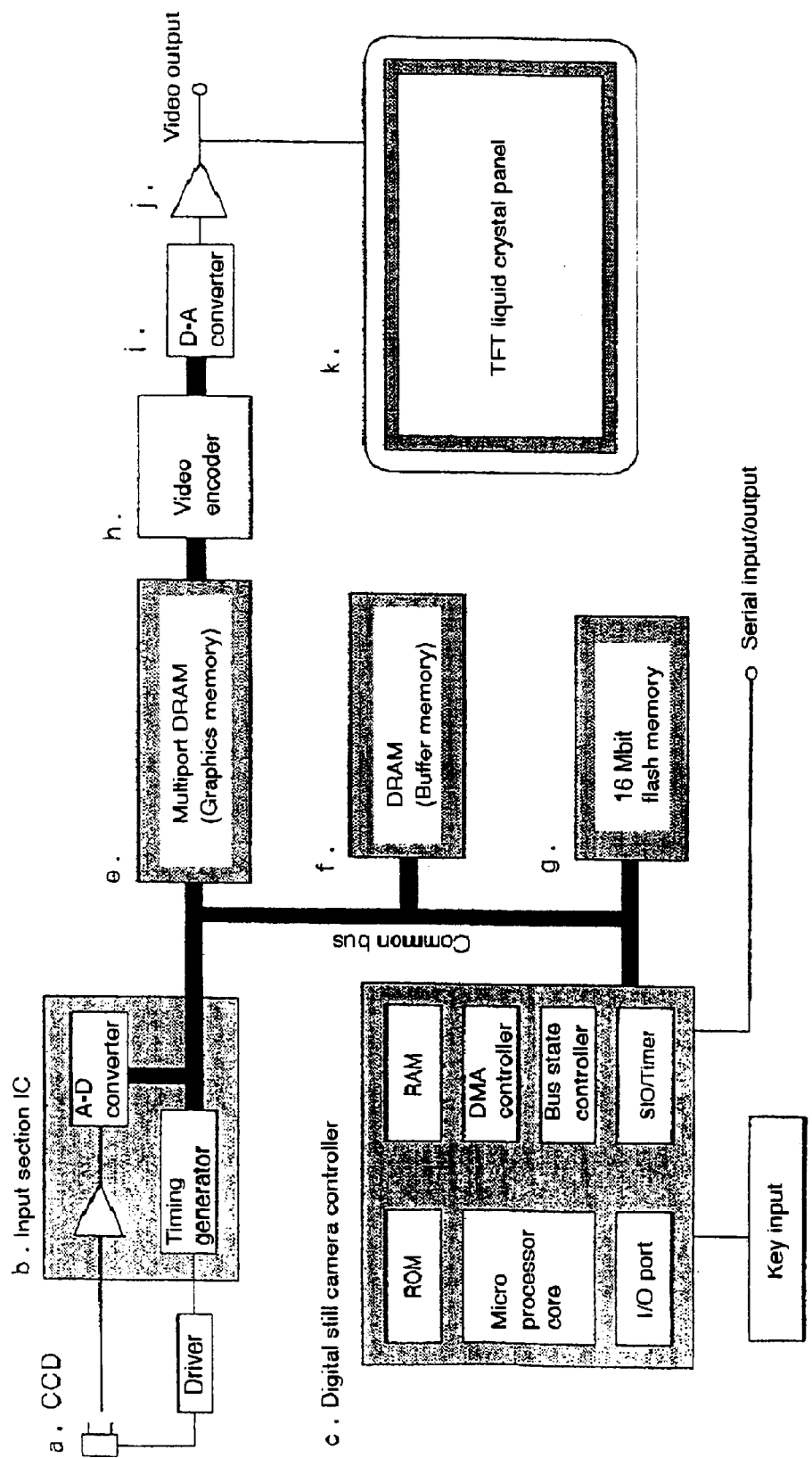
FIG. 2 is a drawing showing a conventional digital still camera system.

To give a specific example of the circuit described above, if the digital still camera system shown in FIG. 2 is considered, the multiport DRAM e and the DRAM f are integrated into a single chip, but by applying the present invention, a normal memory access occurs (input from CCD to DRAM port or memory output to output video output), and sections that do not normally require refresh to be carried out are not refreshed. On the other hand, with the exception of when the shutter button is pressed and an access from the MPU to the DRAM section has occurred, it is possible to perform refresh control of a system that requires refresh, without affecting the stored information.

Also, when the X addresses are consecutive for the memory section including memory array C and the memory section including memory array C', and the output address of the refresh means L is input to the X decoder A and the X decoder A', refresh operations for both memory sections can be controlled by only refresh means L which means that refresh control is simplified.

Fourth Embodiment

Figure 8:
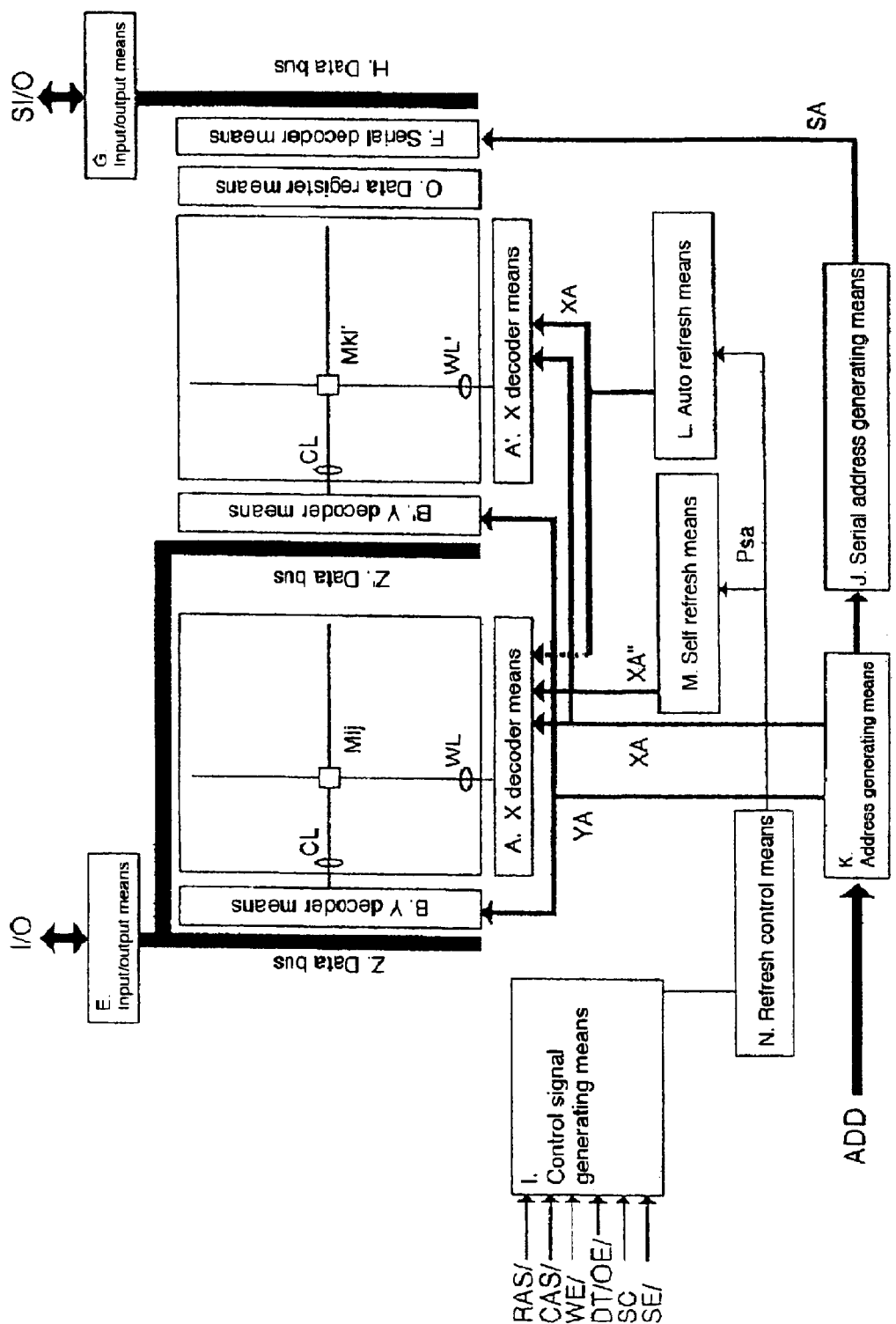
FIG. 8 is a circuit diagram of a fourth embodiment of the present invention.

A circuit diagram of the fourth embodiment is shown in FIG. 8.

The connectional relationship and operation are substantially the same as in the third embodiment. The points of difference between this embodiment and the third embodiment are that the refresh means M in the third embodiment is specified as self refresh means, and the refresh means L in the third embodiment is specified as auto refresh means.

Figure 14:
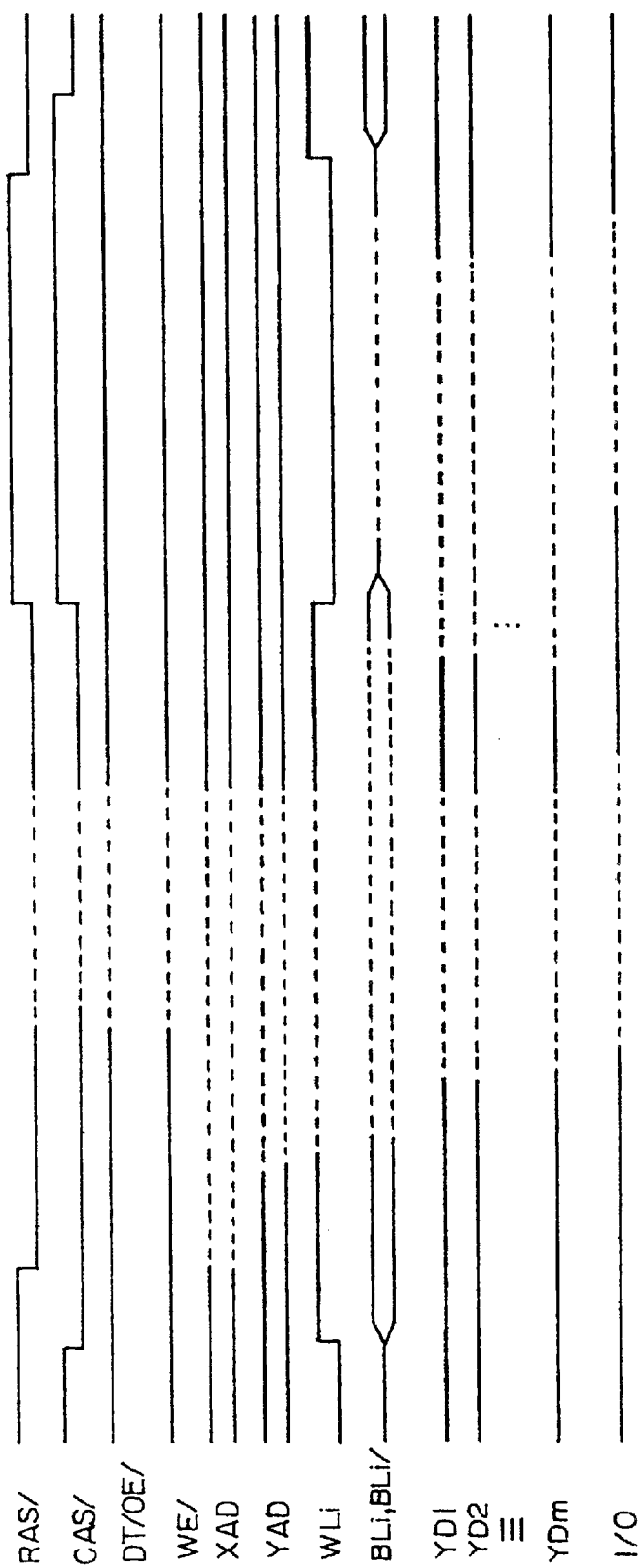
FIG. 14 is a drawing showing auto refresh operation.

In this fourth embodiment, auto refresh means a refresh operation carried out using an internal refresh address generated by incrementing an internal address counter using an externally input clock. In a general purpose DRAM, as shown in FIG. 14, compared to normal operation mode where RAS/ falls earlier than CAS/, auto refresh mode is entered when CAS/ falls at an earlier timing than RAS/ (this is generally called CAS before RAS (CBR) refresh).

Figure 4:
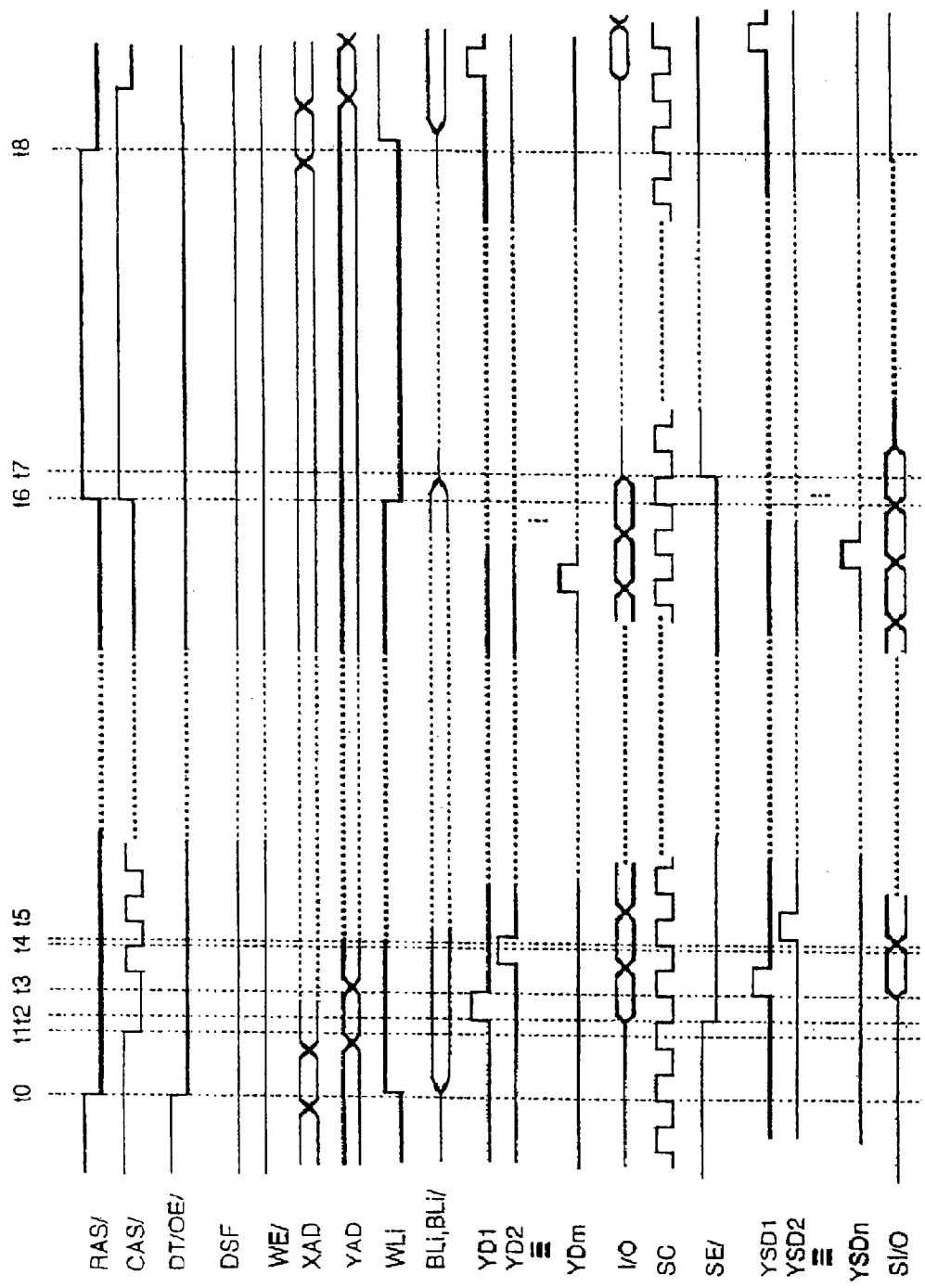
FIG. 4 is a drawing showing the operation of conventional multiport DRAM.
Figure 5:
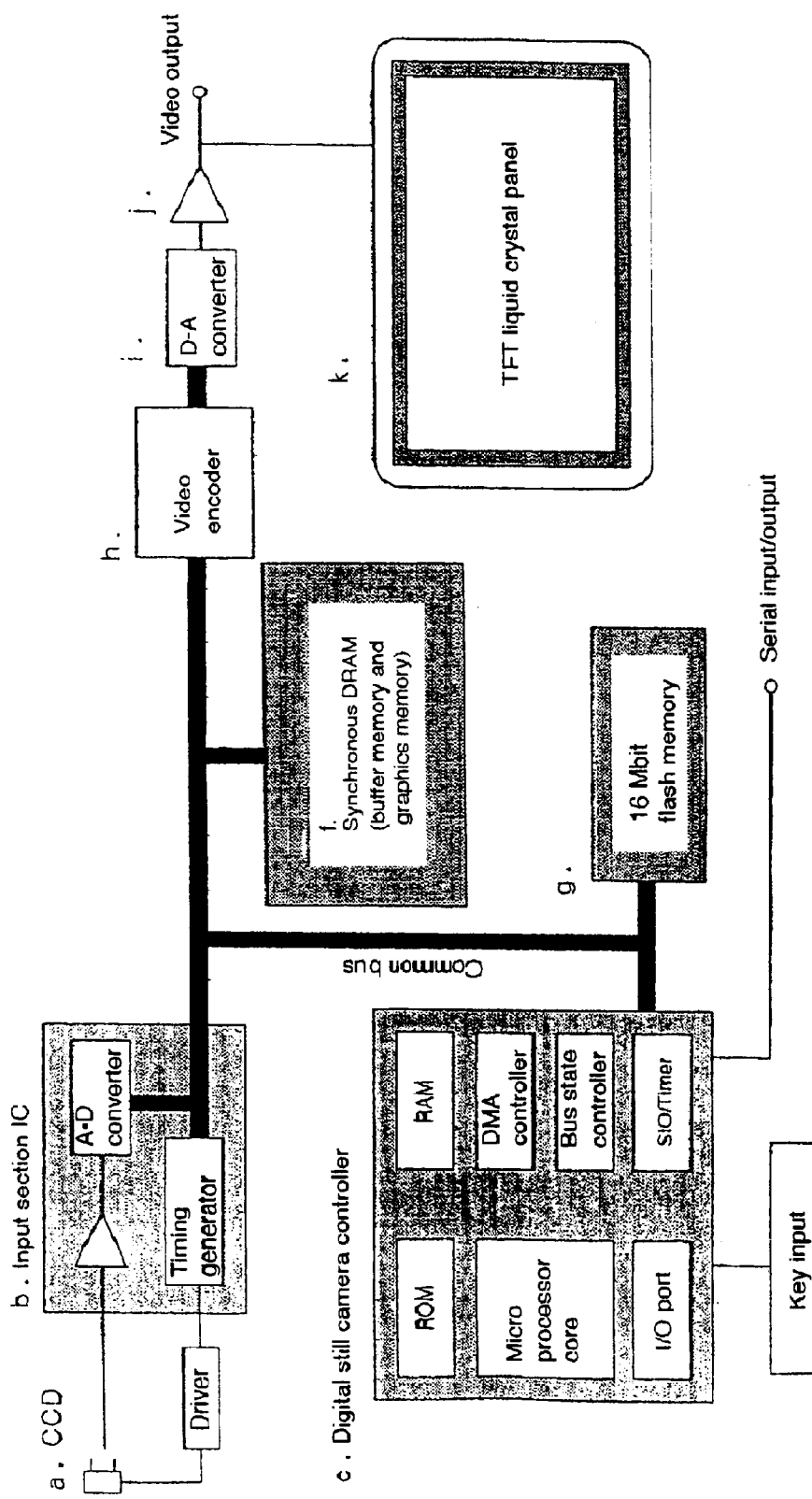
FIG. 5 is a drawing showing a conventional digital still camera system.

The auto refresh operation in FIG. 14 will now be described. The operation is substantially the same as the operation of the DRAM port of the multiport DRAM described in FIG. 4. As shown in the drawing, in auto refresh mode complementary bit line pairs are respectively high or low due to the amplifying operation of the sense amplifiers for information of selected memory cells, as in normal mode. However, since there is no output from the Y decoder there is no operation after that. Determined complementary bit line pair information is written again to selected memory cells. This is the refresh operation.

At the time of the auto refresh operation, input addresses XAD and YAD are ignored. Selection of word line WLi is achieved using an X address for refresh generated by an address counter that is incremented by an externally input clock (by RAS/ and CAS/ in this case). Accordingly, an X address counter is included in the auto refresh means L.

Next, self refresh is refresh that is carried out automatically by incrementing an address counter not with an externally input clock but using an internal oscillator operation, to generate an X address for refresh.

Accordingly, an X address counter and an internal oscillator are included in the self refresh means M.

The basic features of this embodiment are substantially the same as the third embodiment. With this embodiment, in addition to the effects of the first, second and third embodiments, it is possible to refresh a memory section including memory array C having a serial port that is nearly always used for outputting image information, as required, while a memory section including memory array C that usually has a low rate of access is refreshed using self refresh that does not need troublesome refresh control, which means that it is possible to provide a memory which enables simplified control design.

Also, when X addresses are consecutive for the memory section including memory array C and the memory section including the memory array C', and the output address from the refresh means L is input to the X decoder A and the X decoder A', the refresh operation for both memory sections can be controlled by refresh means L alone, which means that the memory section including memory array C and the memory section including the memory array C' can be auto refreshed together as if they were a single memory, using only the self refresh means L.

Fifth Embodiment

Figure 9:
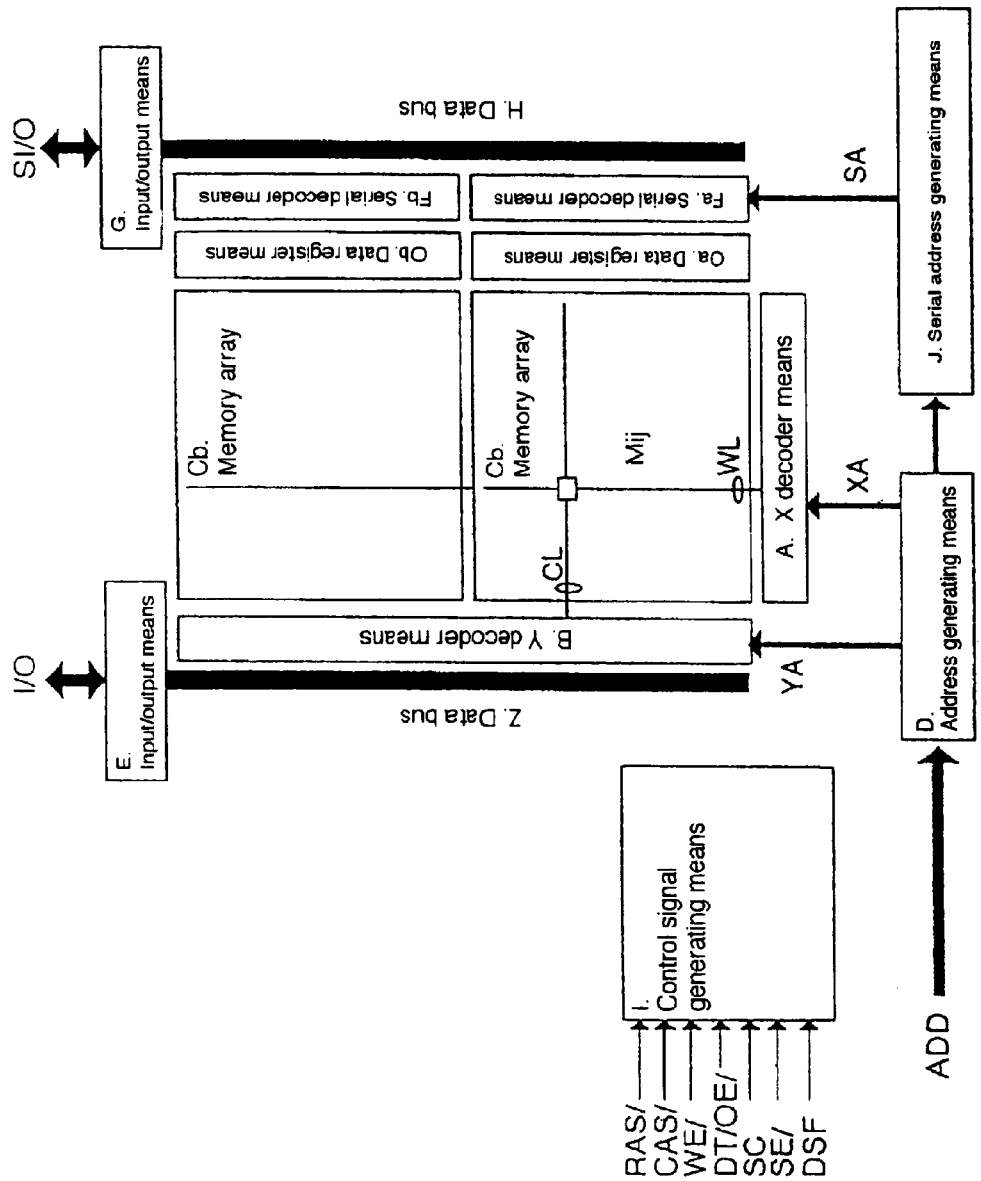
FIG. 9 is a drawing showing a two bank type multiport DRAM.

A block diagram of a two bank type multiport DRAM is shown in FIG. 9. In the first to fourth embodiments a second memory section was described as a single bank memory as described by the circuit diagram of a normal multiport DRAM in FIG. 3. An actual multiport DRAM is a two bank type device, such as is as shown in FIG. 9, in order to prevent serial accesses being interrupted.

Also, a port that is not a DRAM port of a two-port DRAM is not necessarily an SAM port of a general multiport DRAM. As another example, there is a FIFO. A FIFO generally has a two bank structure, and the structure is the same as FIG. 9.

Figure 10:
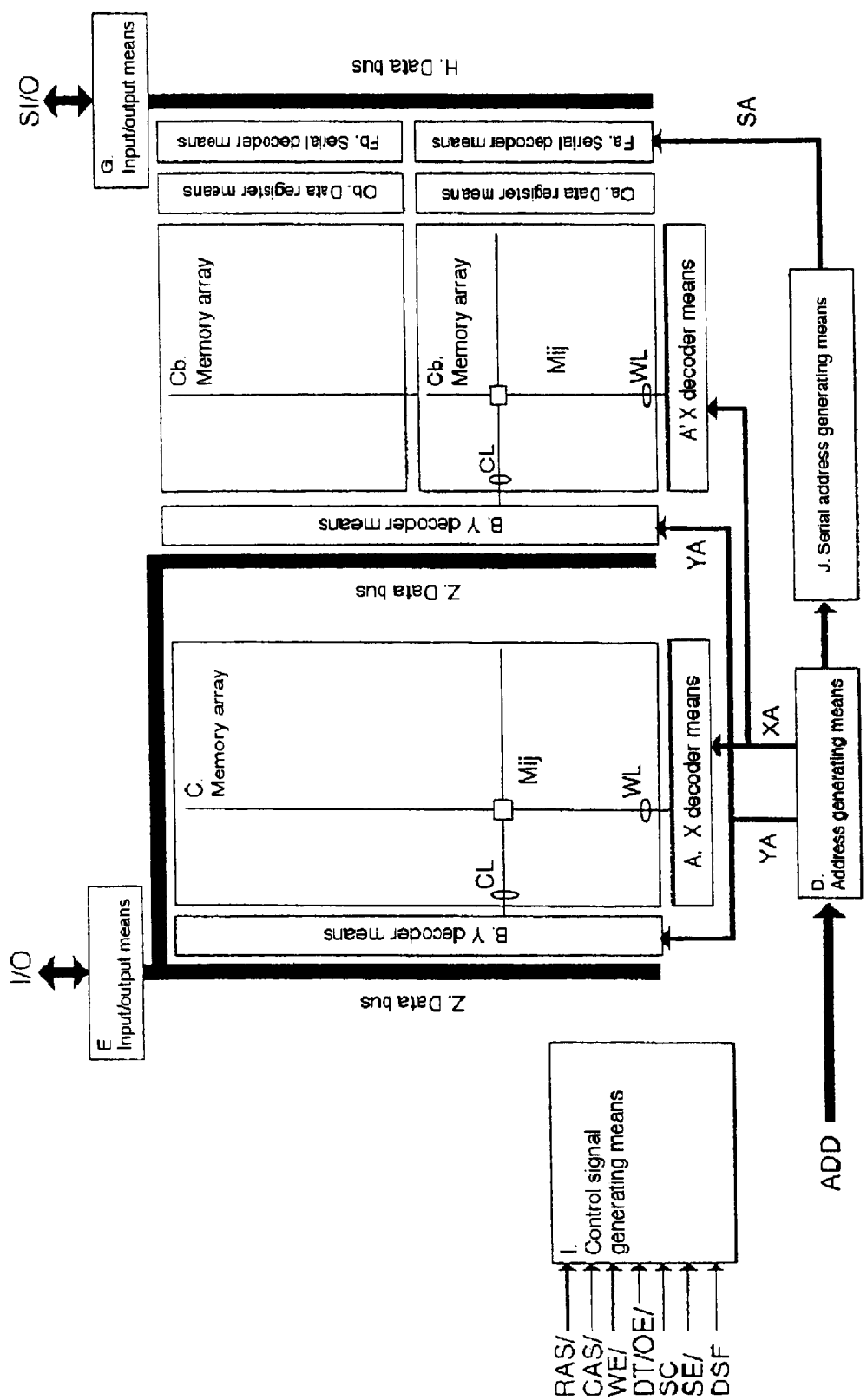
FIG. 10 is a circuit diagram of a fifth embodiment of the present invention.

In the fifth embodiment, as shown in FIG. 10, the memory is a two bank type device.

The connectional relationship and operation are the same as in the first embodiment, so the detailed description thereof will be omitted.

Sixth Embodiment

Figure 11:
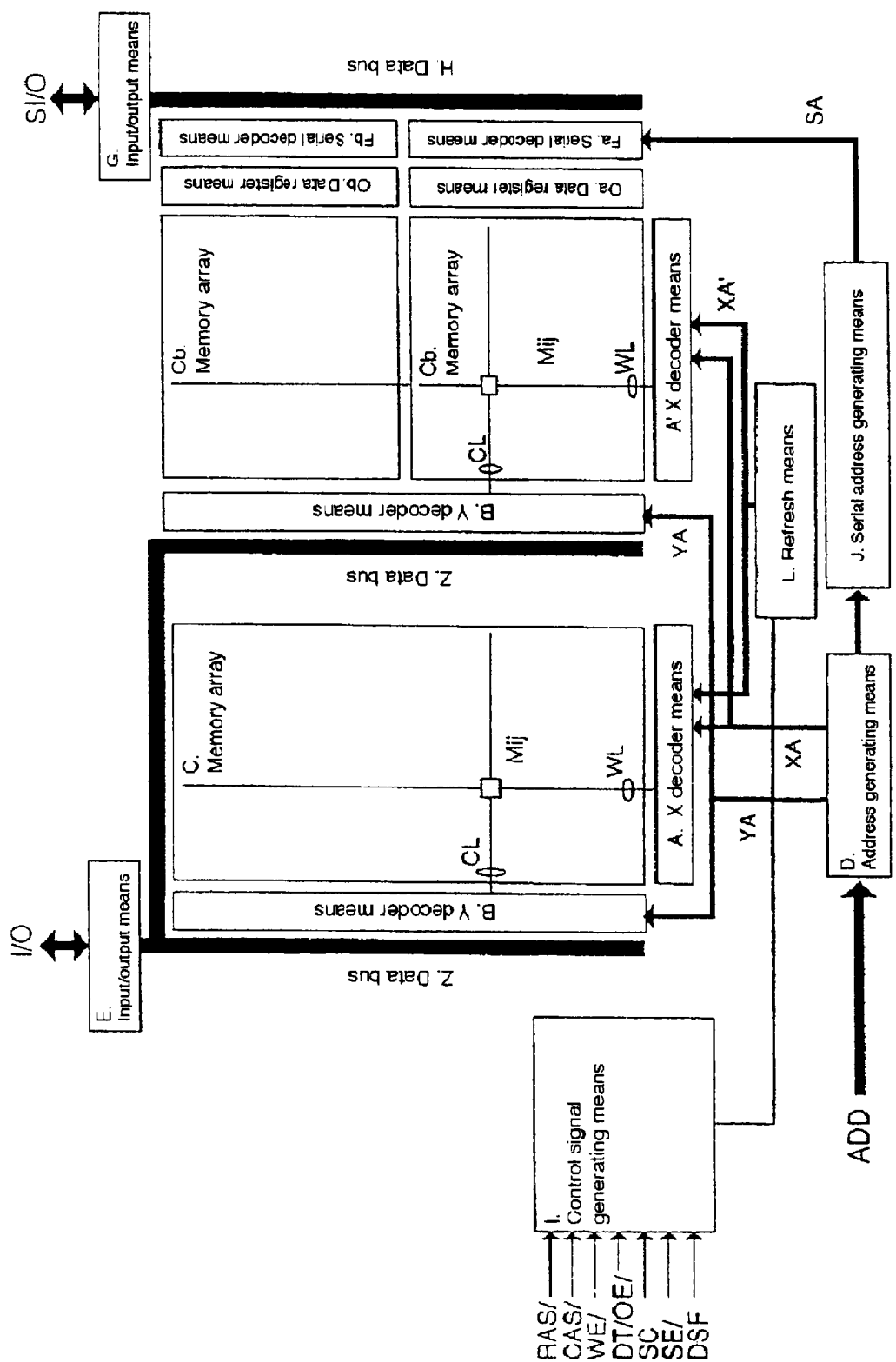
FIG. 11 is a circuit diagram of a sixth embodiment of the present invention.

In the second embodiment, the second memory section was described as a single bank memory as described by the circuit diagram of a normal multiport DRAM in FIG. 3. An actual multiport DRAM is a two bank type device, such as is as shown in FIG. 11, in order to prevent serial accesses from being interrupted.

The connectional relationship and operation are the same as in the second embodiment, so the detailed description thereof will be omitted.

Seventh Embodiment

Figure 12:
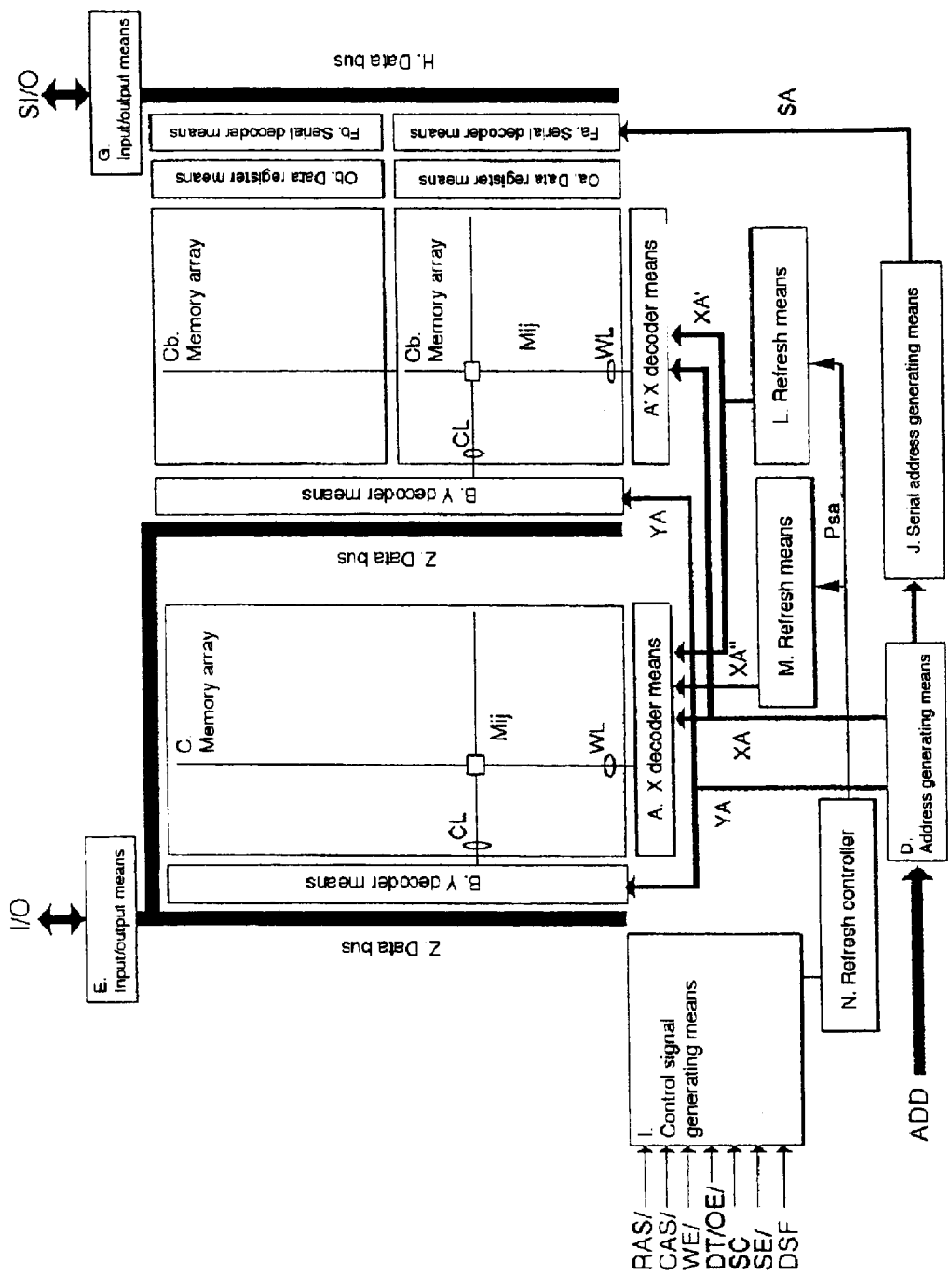
FIG. 12 is a circuit diagram of a seventh embodiment of the present invention.

In the third embodiment, the second memory section was described as a single bank memory as described by the circuit diagram of a normal multiport DRAM in FIG. 3. An actual multiport DRAM is a two bank type device, such as is as shown in FIG. 12, in order to prevent serial accesses from being interrupted.

The connectional relationship and operation are the same as in the third embodiment, so the detailed description thereof will be omitted.

Eighth Embodiment

Figure 13:
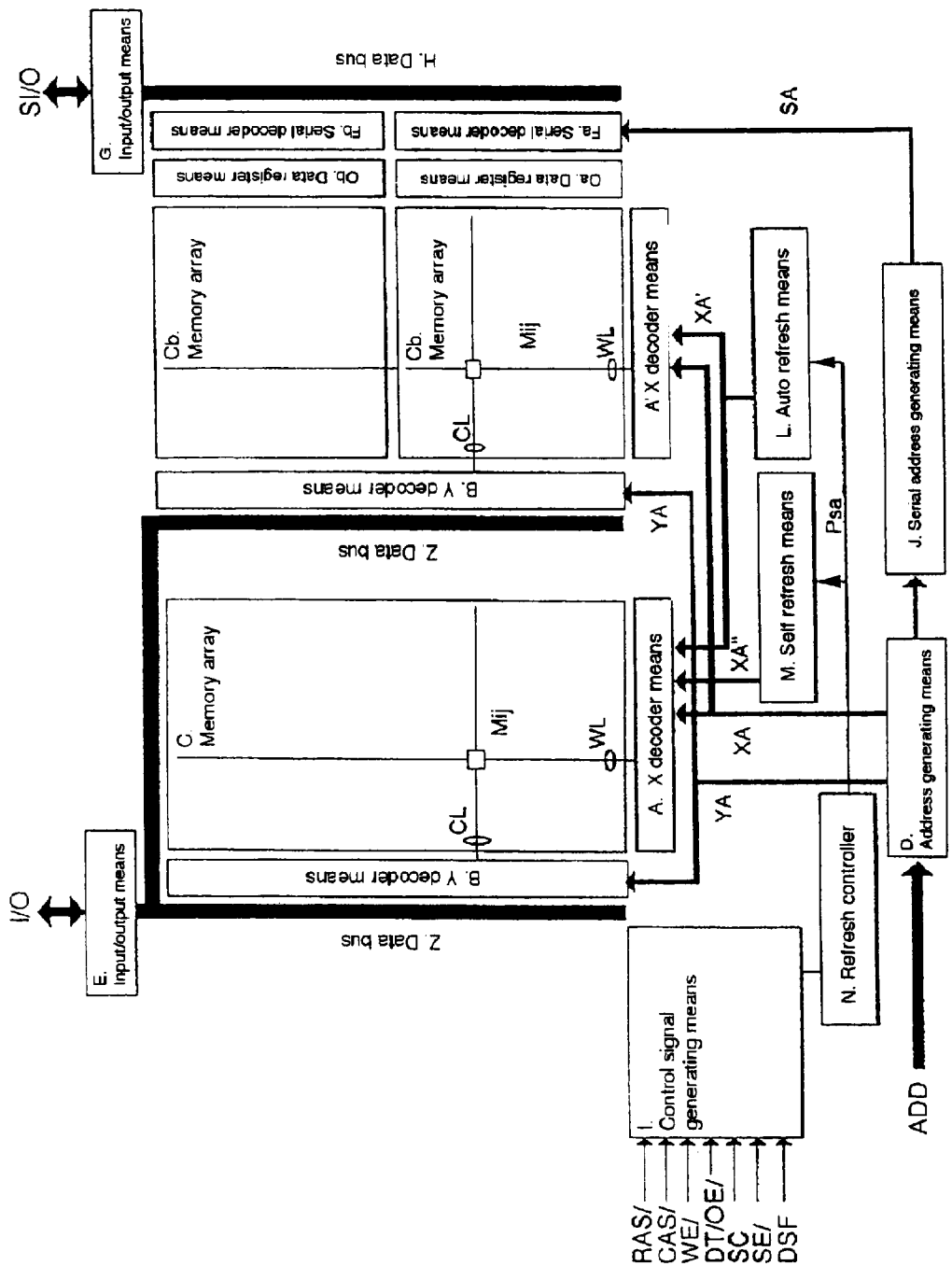
FIG. 13 is a circuit diagram of an eighth embodiment of the present invention.

In the fourth embodiment, a second memory section was described as a single bank memory as described by the circuit diagram of a normal multiport DRAM in FIG. 3. An actual multiport DRAM is a two bank type device, such as is as shown in FIG. 13, in order to prevent serial accesses being interrupted.

The connectional relationship and operation are the same as in the fourth embodiment, so the detailed description thereof will be omitted.

Industrial Applicability

As has been described in detail above, a memory of the present invention has a multiport DRAM and a general purpose DRAM having consecutive X addresses, common Y address, and common control terminals, in order to perform efficient refresh control. This means that using the memory of the present invention, it is possible to provide a memory with reduced port area and excellent cost performance by combining a conventional multiport DRAM with a DRAM used as a temporary buffer, without losing the strong points of a conventional multiport DRAM.

I claim:

1. A semiconductor memory device capable of random access, comprising:

address generator, provided with external address signals, for generating an internal X address and an internal Y address;

serial address generating means for generating a serial address;

a single port first memory composition section, comprised of a first memory array having memory unit groups, for connecting first X decoder means supplied with said internal X address and first Y decoder means supplied with said internal Y address, and a first data bus connected to said first Y decoder means;

a two port second memory composition section, comprised of a second memory array having memory unit groups for connecting second X decoder means supplied with said internal X address and second Y decoder means supplied with said internal Y address, a second data bus connected to said second Y decoder means and connected to said first data bus, data register means for connecting to said second memory array, serial decoder means for connecting to said data register means and supplied with said serial address, and a third data bus connected to said serial decoder means;

first input means having input output terminals for connecting a mutually connected first data bus and a second data bus;

second input output means having at least output terminals for connecting to a third data bus;

control signal generating means, supplied with external control signals for controlling a memory comprising the above structural elements, for generating internal control signals for controlling memory peripheral circuits capable of memory access.

2. The memory device as disclosed in claim 1, wherein an X address for selecting said first memory composition section and an X address for selecting said second memory composition section are consecutive.

3. The memory device as disclosed in claim 2, having externally input control signals for controlling said first memory composition section, and externally input control signals for controlling said second memory composition section, and these control signals are common.

4. The memory device as disclosed in claim 3, wherein a Y address input to said first Y decoder means and a Y address input to said second Y decoder means are common.

5. The memory device as disclosed in claim 1, further comprising refresh means connected to said first X decoder means and said second X decoder means.

6. The memory device as disclosed in claim 5, wherein an X address for selecting said first memory composition section and an X address for selecting said second memory composition section are consecutive.

7. The memory device as disclosed in claim 6, having externally input control signals for controlling said first memory composition section, and externally input control signals for controlling said second memory composition section, and these control signals are common.

8. The memory device as disclosed in claim 7, wherein a Y address input to said first Y decoder means and a Y address input to said second Y decoder means is common.

* * * * *